(12) United States Patent
Rooymans

(10) Patent No.: US 9,775,213 B2
(45) Date of Patent: Sep. 26, 2017

(54) SPECTRAL EQUALIZER

(71) Applicant: Gemex Consultancy B.V., Oss (NL)

(72) Inventor: Johannes Otto Rooymans, Oss (NL)

(73) Assignee: Gemex Consultancy B.V., Oss (NL)

( * ) Notice: Subject to any disclaimer, the term of this patent is extended or adjusted under 35 U.S.C. 154(b) by 0 days.

(21) Appl. No.: 15/107,940

(22) PCT Filed: Dec. 24, 2014

(86) PCT No.: PCT/NL2014/050910
§ 371 (c)(1),
(2) Date: Jun. 24, 2016

(87) PCT Pub. No.: WO2015/099536
PCT Pub. Date: Jul. 2, 2015

(65) Prior Publication Data
US 2016/0323959 A1 Nov. 3, 2016

(30) Foreign Application Priority Data
Dec. 24, 2013 (NL) .................................. 2012028

(51) Int. Cl.
*H05B 33/08* (2006.01)
*H01L 33/50* (2010.01)
*F21K 9/64* (2016.01)

(52) U.S. Cl.
CPC ......... *H05B 33/0857* (2013.01); *H01L 33/50* (2013.01); *F21K 9/64* (2016.08); *H01L 33/502* (2013.01); *H01L 2933/0041* (2013.01)

(58) Field of Classification Search
USPC .... 362/230, 231, 227, 257, 293, 2, 600, 601
See application file for complete search history.

(56) References Cited

U.S. PATENT DOCUMENTS

2012/0169239 A1* 7/2012 Chen ................... H05B 33/0851
315/152
2013/0020929 A1* 1/2013 van de Ven ......... H01L 25/0753
313/498
2013/0249389 A1* 9/2013 Ishiwata ............... H01L 33/502
313/512

* cited by examiner

Primary Examiner — Tuyet Vo
(74) Attorney, Agent, or Firm — NLO N.V.; Catherine A. Shultz; Minerva Rivero

(57) ABSTRACT

A lighting arrangement is disclosed having a first light source with a dominant wavelength in the range of 505 nm to 520 nm; and a second light source having a dominant wavelength in the range of from 580 nm to 630 nm. The lighting arrangement has at least one control means for adjusting the output of the first light source independent from the light output of the second light source.
The control means allows for providing an optimum spectral balance under varying luminance levels.

16 Claims, 3 Drawing Sheets

SPECTRAL EQUALIZER

BACKGROUND OF THE INVENTION

1. Field of the Invention

The invention relates generally to a lighting arrangement having light sources emitting light at different wavelengths, and means for adjusting the relative light outputs of the different light sources.

2. Description of the Related Art

Artificial lighting, in particular in outdoor settings, operates at luminance levels associated with mesopic vision. There is a growing recognition that for mesopic conditions the output efficiency of a lighting arrangement expressed in Lumen/Watt, is a poor measure of a light arrangement's performance and perception and that the scotopic/photopic ratio of the emitted light must be taken into account.

US 2012/0169239 A1 discloses a lighting arrangement comprising a light sensor and multiple light emitting units. The light emitting units can be independently controlled in order to generate light having an optimum S/P ratio for the prevailing luminance conditions. The lighting arrangement is capable of emitting light at 555 nm, so that light having low S/P ratio can be emitted under photopic conditions.

EP 2 246 611 A1 discloses bi-chromatic light sources with two different wavelengths, a first wavelength in the range from 560-610 nm and a second wavelength in a range of either 500-550 nm or 610-660 nm. The light source of the first wavelength emits light continuously. The light source of the second wavelength is switched on during critical periods. The intensities of the two light sources are not modulated.

US 2008/0252197 A1 discloses a white light source with tunable color temperature. The light source contains two light emitting units, which can be phosphor conversion LEDs. The two light emitting units comprise phosphors emitting light of different color temperatures. The color temperature of the light source can be adjusted by adjusting the power sent to each of the two light emitting units.

Optimizing the spectral distribution for a high S/P ratio by itself does not take into account the importance of optimizing the spectral distribution for contrast and/or color vision. Prior art lighting arrangements also fail to take into account that blue light, although favorable for a high S/P ratio, is poorly processed by the eyes of elderly people due to yellowing of eye lenses with age. As yellow filters out blue light, up to 50% or more of the blue part of the spectrum does not reach the retina of the eye of an older person.

Thus, there is a need for a lighting arrangement permitting adjustment of the spectral distribution in response to luminance level, to optimize contrast and/or color vision while maintaining a high S/P ratio. There is a further need of such lighting arrangement that avoids the use of a wideband V(λ) phosphor conversion LED having a maximized luminous emission at 555 nm.

BRIEF SUMMARY OF THE INVENTION

The present invention addresses these problems by providing a lighting arrangement comprising a first light source having a dominant wavelength in the range of 505 nm to 520 nm; a second light source having dominant wavelength in the range of from 580 nm to 630 nm; and a first control means for adjusting a light output of the first light source independent from a light output of the second light source. The lighting arrangement does not comprise a light source having a substantial light emission at 555 nm. Specifically, the lighting arrangement avoids the use of a green LED having a peak wavelength greater than 520 nm. The lighting arrangement may comprise a narrow band phosphor conversion LED having suppressed luminous emission at 555 nm.

DETAILED DESCRIPTION OF THE INVENTION

Figure 1:
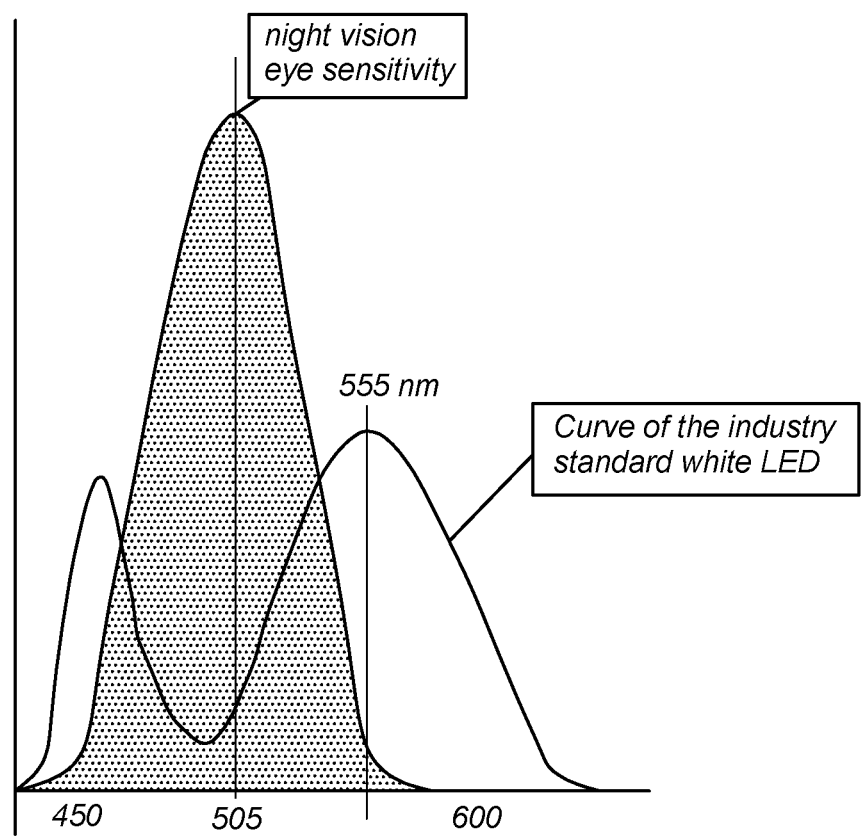
FIG. 1 depicts the spectral distribution of an industry standard white LED light source and the sensitivity of the human eye under night vision conditions as a function of wavelength.

The following is a detailed description of the invention.

Definitions

The term "dominant wavelength" as used herein with reference to a light source means the peak of the spectral distribution of the light emitted by the light source.

The term "luminance level" or "illuminance" as used herein refers to the overall amount of light in a particular place or area. The luminance level is determined by the sum of light received in the particular place or area from all available sources. For example, the place or area may receive light from several artificial lighting arrangements. Under twilight conditions the place or area may receive both artificial light and (indirect) sunlight. Outdoor areas may receive light from one or more artificial lighting arrangements as well as from the moon, for example. The luminance level can be expressed in candela per square meter ($cd/m^2$) or in lux. For a single lighting arrangement the illuminance is defined as the luminous intensity of the lighting arrangement (expressed in cd) divided by the square of the distance to the lighting arrangement (in m); $1\ cd/m^2 = 1$ lux.

The term "mesopic" as used herein refers to lighting conditions under which the rods in the human retina make an important contribution to the signal received by the human brain. Under bright conditions, such as full daylight, virtually all, or perhaps all light received by the retina is processed by the cones. This is referred to as "photopic conditions." Under very dim conditions virtually all, or perhaps all light received by the retina is processed by the rods. This is referred to as "scotopic conditions." There is a range of light conditions between photopic and scotopic conditions in which both the rods and the cones significantly contribute to vision. This range is referred to as "mesopic conditions." There is no unanimity in the literature on the boundaries of the mesopic range. In all likelihood these boundaries vary per individual. For the purpose of the present invention the mesopic range is defined as the range of luminance levels from 0.1 lux to 100 lux.

Under photopic conditions the maximum sensitivity of the eye is at a wavelength of 555 nm. For scotopic conditions the maximum is at 498 nm. Under mesopic conditions it is desirable to emphasize the light output at and near 505 nm where the combination of rods and cones are most sensitive, and to de-emphasize the light output at 555 nm, which is where the cones are most sensitive. Emphasizing the light output at 505 nm and reducing the light output at 555 nm results in a high scotopic/photopic ratio (S/P ratio). There is a growing recognition that a high S/P ratio, for example in the range of from 1.5 to 4, is desirable for better visual acuity.

However, a single minded focus on high S/P ratios is short sighted, because it ignores a number of other factors that are relevant to the overall effectiveness of artificial lighting.

The first such factor is color vision. The cones are responsible for color vision. The retina contains three types of cones for short, long and medium wavelengths, labeled S, L and M. S-type cones contain a blue pigment and are most sensitive to light wavelengths in the range of 420 nm to 440 nm. M-type cones contain a green pigment and are most sensitive to light wavelengths in the range of 534 to 545 nm. L-type cones contain a red pigment and are most sensitive to light in the range of 564 to 580 nm. When light of a specific color reaches the retina, the three types of cones each send a signal to the brain that is proportional in strength to the amounts of light in the respective wavelength ranges. The brain processes these signals, and translates differences in signal strengths to the corresponding colors or color mix. Thus, if the brain receives a strong signal from the S-type cones, and weak signals from the M-type and L-type cones, it concludes that the color is blue. If the brain receives a strong signal from the L-type cones and a much weaker signal from the M-type and S-type cones it concludes that the color is red, etc.

This mechanism of our color vision has several implications. The first one is that color vision is not possible under scotopic conditions, because by definition the cones are not active under scotopic conditions. Another implication is that green/red color vision relies on response differences between the M-cones and the L-cones, which have their peak sensitivities very close together. Both cone types M- and L-cones are sensitive over almost the whole visual range. Under mesopic conditions the brain has great difficulty detecting signal differences between the L-type cones and the M-type cones, so that the colors green, yellow and red are no longer registered. Put differently, under low mesopic conditions most people are color blind for the three colors that are most important in traffic.

Industry standard white LED light sources use blue LED chips, having a peak at about 450 nm, and a white phosphor with a peak at 555 nm (see FIG. 1). Depending on the relative contribution of unconverted blue light to the overall output and color temperature, such light sources may well boast an S/P ratio of 2.5 or higher, but the actual perceived performance of such light sources is poor. The spectral distribution shows a dip at 505 nm, which is the wavelength of maximum mesopic sensitivity. Moreover, the peak at 555 nm (right between the maximum sensitivities of the L-type and M-type cones) causes poor color distinction in the red-orange-green range, because the light intensities at their respective peak sensitivities is about equal.

Yet another factor overlooked by industry standard blue-plus-white phosphor LEDs is the importance of light at or near 505 nm for contrast vision under mesopic conditions. As noted earlier, such industry standard LEDs have low spectral intensity in the 505 nm range.

As noted earlier, the S/P ratio of industry standard LEDs is determined in large part by the contribution of the blue light to the overall light output. However, the lens of the human eye gradually turns yellow with age. The yellow pigment in the eye lens partially blocks the blue light, so that 30 to 70% or less actually reaches the retina. Light output as measured by an instrument (which detects all of the blue light and calibrated on photopic conditions ($V(\lambda)$ defined by the CIE in 1931) produces a higher number than what is actually perceived by a person, in particular if the person is elderly.

Yet another factor is the fact that light in the 500 to 530 nm range is significantly responsible for melatonin suppression. Melatonin is a hormone that induces sleep. Its suppression is very important to keep drivers and factory workers alert. For this reason it is important to provide artificial light containing a significant portion of light in the 500 to 530 nm range in its spectral distribution.

Another factor is that our vision acuity does not diminish equally for all wavelengths as the luminance level decreases. A spectral distribution that is perceived as well balanced at 100 lux is perceived as poorly balanced at, for example, 10 lux. The effect is similar to our hearing. When we hear music at a moderate volume our ears are able to detect bass and treble tones well. As the volume is turned down, our ability to detect bass and treble tones diminishes, and the music sounds flat. Equalizers have been developed that allow us to exaggerate bass and treble tones at low volumes, so that the music is once again perceived as balanced. Under mesopic conditions light would similarly benefit from an ability to "exaggerate" specific parts of the spectrum in order to restore the perceived balance.

In its broadest aspect the present invention relates to a lighting arrangement comprising a first light source having a dominant wavelength in the range of 505 nm to 520 nm; a second light source having dominant wavelength in the range of from 580 nm to 630 nm; and a first control means for adjusting a light output of the first light source independent from a light output of the second light source. Importantly, the lighting arrangement does not have to comprise a light source having a substantial emission at 555 nm, such as a green LED or a wide band phosphor conversion LED.

Increasing the relative contribution of the first light source to the overall light output of the lighting arrangement results in an improved contrast vision. Decreasing the relative contribution of the first light source to the overall light output of the lighting arrangement results in an increased color sensation.

In an embodiment the lighting arrangement further comprises a second control means for adjusting the light output of the second light source independent from the light output of the first light source. Having a second control means makes it possible to increase the light outputs of both light sources; or to decrease the light outputs of both light sources; or increase one and decrease the other.

In an embodiment the lighting arrangement comprises a third control means for adjusting a bandwidth of the light output of the first light source. The first control means modifies the amplitude of the peak wavelength of the first light source (for example 505 nm). There is a limit to the amount by which the light output of the first light source can be modified using the first control means, without significantly affecting the color of the light output of the lighting arrangement. Modifying the bandwidth using the third control means provides an additional tool for controlling the spectral output of the first light source changing the S/P ratio without significantly affecting the light's color.

In an embodiment the lighting arrangement comprises a third light source having a dominant wavelength in the range of from 430 nm to 480 nm. This third light source, providing blue light, contributes to white light color of the light source. It has been found that independent adjustment of the intensity of the third light source results in a color temperature adjustment while keeping the overall light output at or near the black body curve.

In an embodiment the first light source comprises one or more cyan LEDs.

In an embodiment the second light source comprises one or more red LEDs.

In an embodiment the third light source comprises one or more blue LEDs.

The control means may be operable in a number of different ways. For example, the control means may be moved to an optimum setting for the specific lighting situation at the time of installation, and then left at this setting for an important part or all of the useful life of the lighting arrangement. The optimum setting may depend on the area being lighted. For example, in a restaurant, an outdoor eating area or a flower garden faithful color rendition is important. Under very low light intensities, such as moonlight, colors are vanished. The controls may be set for optimum color sensation and rendition under lighting conditions with higher than mesopic light intensity. In other lighting situations, such as stair wells, parking lots and the like, vision acuity may be deemed more important than color rendition, and the controls may be set to provide optimum acuity, if necessary at the expense of color rendition.

In other situations it may be desirable to manually adjust the control means. For example, a restaurant owner may choose a high contrast setting for maintenance and cleaning of the restaurant, and a high color sensation setting during dining. Homeowners may want to be able to adjust settings for specific activities, with a contrast setting for reading, for example, and a color setting for entertaining guests.

In yet other situations is may be desirable to provide control means for automatic operation. As noted above, the required adjustments differ with different luminance levels. A sensor may determine the luminance level, which is provided as an input to a controller. The controller then adjust the settings of the control means in function of the luminance level, for example based on a pre-programmed algorithm.

The lighting arrangement may have an overall light output such that the resulting luminance level is in the range of from 0.1 lux to 100 lux but is not limited to a maximum lighting level When in use, the lighting arrangement may emit light having spectral peaks near or at 420 nm (blue); in the range of from 505 nm and 520 nm (cyan); and in the range of from 600 nm to 650 nm (red).

When in use the lighting arrangement may emit white light with a CCT of from 2000K to 8000K.

When in use the lighting arrangement may emit light having an S/P ratio in the range of from 1.5 to 4.

Description Of Illustrative Embodiments/Examples

The following is a description of certain embodiments of the invention, given by way of example only.

Curve 1 of FIG. 1 shows the spectral distribution of the light output of an industry standard white LED light source. The LED light source comprises a blue LED with a spectral peak near 450 nm. Light produced by the blue LED is converted by a phosphor to white light having a spectral peak at 555 nm. The overall light output of the light source consists of unconverted blue light from the LED, and white light converted by the phosphor.

Curve 2 of FIG. 1 shows the sensitivity of the human eye as a function of wavelength, under night vision conditions. As vision under these conditions is predominantly dependent on the rods, the curve has a peak at 505 nm. As can be seen, the spectral distribution of an industry standard white LED has a dip at or near 500 nm. The LED produces only a limited amount of light in the wavelength range where the rods are most sensitive. As a consequence the light output of the industry standard white LED is of poor efficiency under mesopic lighting conditions.

Figure 2:
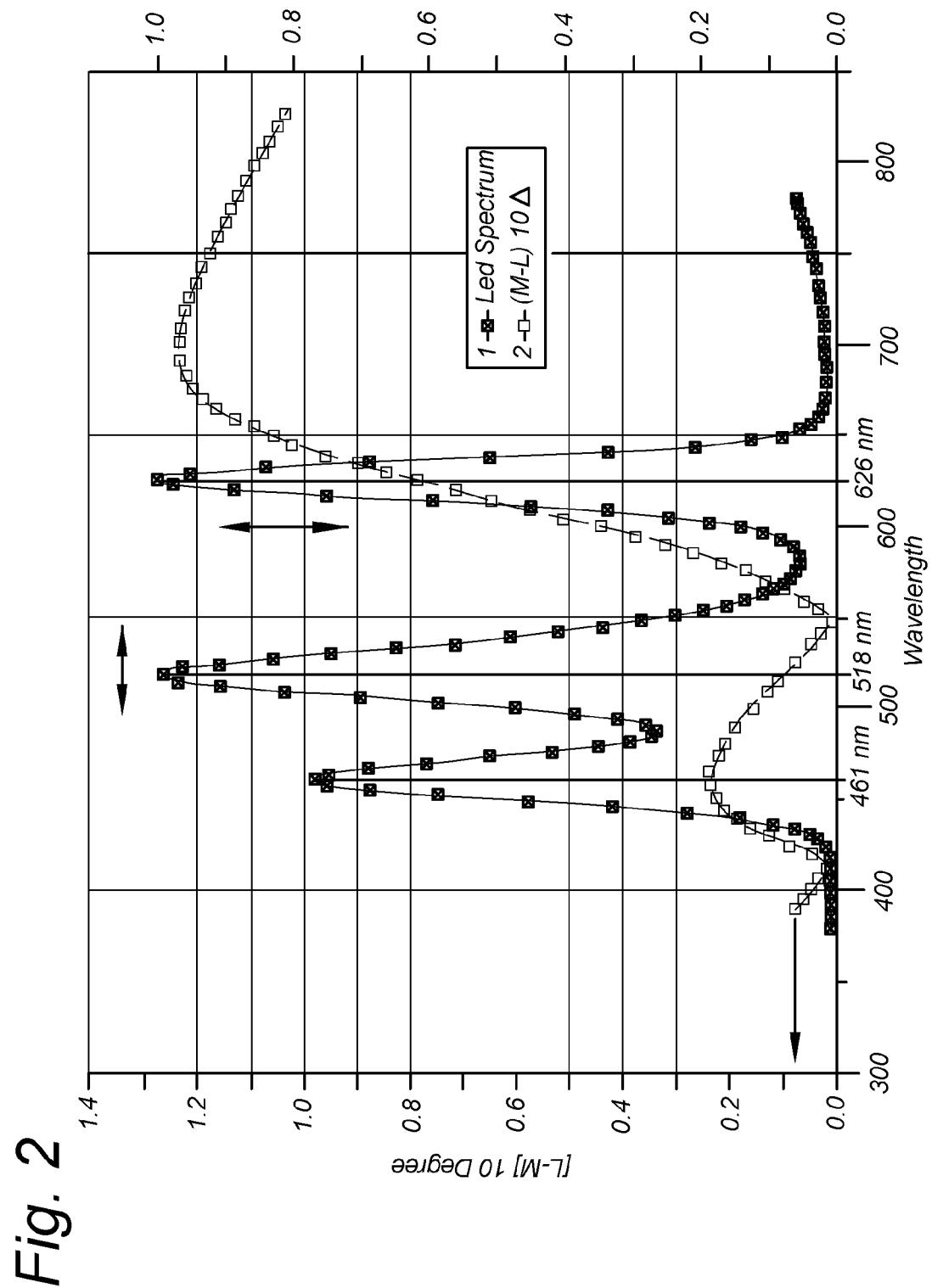
FIG. 2 shows the spectral distribution of an embodiment of the lighting arrangement of the invention.

Curve 1 of FIG. 2 shows the spectral distribution of the light output of a lighting arrangement suitable for the present invention. The lighting arrangement comprises one or more blue LEDs having a spectral peak at 461 nm; one or more cyan LEDS having a spectral peak at 518 nm; and one or more red LEDs having a spectral peak at 626 nm. According to the invention the lighting arrangement comprises a means for adjusting the light output of the cyan LED or LEDs relative to the red LED or LEDs. With reference to FIG. 1, increasing the light output of the cyan LED or LEDs increases the light output in the wavelength range where the rods are most sensitive. The result is improved vision acuity, for example improved contrast. Curve 2 in FIG. 2 is the delta between the green and red cones, showing the signal difference between the red and green cones in the brain, creating the color sensation.

According to the invention the lighting arrangement may also have a means for adjusting the light output of the red LED or LEDs relative to the cyan LED or LEDs. Increasing the light output of the red LED or LEDs results in improved color perception.

Figure 3:
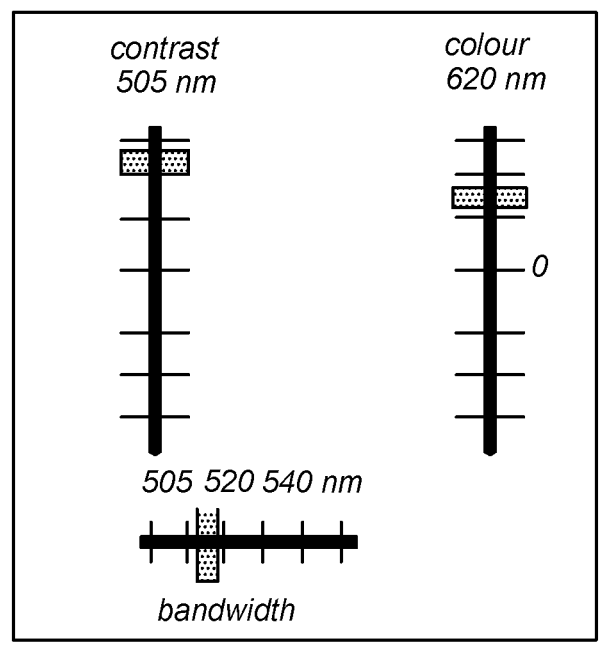
FIG. 3 shows a control means for use with a lighting arrangement of the invention.

FIG. 3 shows an embodiment of a control means for use with the lighting arrangement of, for example, FIG. 2. Slide control 10 modulates the light output at 505 nm; slide control 11 modulates the light output at 620 nm. Slide control 12 modulates the bandwidth of the light output in the 505 nm to 540 nm range.

Thus, the invention has been described by reference to certain embodiments discussed above. It will be recognized that these embodiments are susceptible to various modifications and alternative forms well known to those of skill in the art.

Many modifications in addition to those described above may be made to the structures and techniques described herein without departing from the spirit and scope of the invention. Accordingly, although specific embodiments have been described, these are examples only and are not limiting upon the scope of the invention.

What is claimed is:

1. A lighting arrangement comprising a first light source having a dominant wavelength in the range of 505 nm to 520 nm; a second light source having dominant wavelength in the range of from 580 nm to 630 nm; not more than one phosphor conversion LED; and a first control means for adjusting a light output of the first light source independent from a light output of the second light source.

2. The lighting arrangement of claim 1 further comprising a second control means for adjusting the light output of the second light source independent from the light output of the first light source.

3. The lighting arrangement of claim 1 wherein the first light source comprises one or more cyan LEDs.

4. The lighting arrangement of claim 1 wherein the second light source comprises one or more red LEDs.

5. The lighting arrangement of claim 1 wherein at least one of the first control means and the second control means is designed for manual operation.

6. The lighting arrangement of claim 1 producing, when in use, a luminance level in the range of from 0.1 lux to 100 lux.

7. The lighting arrangement of claim 1 producing, when in use, a spectral distribution having a spectral peak in the range of from 505 nm and 520 nm.

8. The lighting arrangement of claim 1 producing, when in use, white light with a CCT of from 2000 K and 8000 K.

9. The lighting arrangement of claim 1 producing, when in use, light having an S/P ratio in the range of from 1.5 to 4.

10. The lighting arrangement of claim 1 comprising a third light source having a dominant wavelength in the range of from 430 nm to 480 nm.

11. The lighting arrangement of claim 10 wherein the third light source comprises one or more blue LEDs.

12. The lighting arrangement of claim 1 wherein at least one of the first control means and the second control means is designed for automatic operation.

13. The lighting arrangement of claim 12 wherein the automatic operation uses luminance level as an input parameter.

14. The lighting arrangement of claim 1, further comprising a third control means for adjusting a bandwidth of the light output of the first light source.

15. The lighting arrangement of claim 14, wherein at least one of the first control means, the second control means and the third control means is designed for manual operation.

16. The lighting arrangement of claim 14, wherein at least one of the first control means, the second control means and the third control means is designed for manual operation.

* * * * *